United States Patent [19]

Huang et al.

[11] Patent Number: 5,736,771
[45] Date of Patent: Apr. 7, 1998

[54] MASK ROM CELL STRUCTURE WITH MULTI-LEVEL DATA SELECTION BY CODE

[75] Inventors: Hon-Shen Huang, Taipei; Zon-Sheng Wu; Kun-Lu Chen, both of Hsin Chu, all of Taiwan

[73] Assignee: United Microelectronics Corporation

[21] Appl. No.: 597,980

[22] Filed: Feb. 7, 1996

[51] Int. Cl.⁶ .......................... H01L 29/772; G11C 17/00
[52] U.S. Cl. .......................... 257/390; 257/391; 365/94; 365/104
[58] Field of Search .......................... 257/390, 391; 365/94, 104

[56] References Cited

U.S. PATENT DOCUMENTS 5,236,853   8/1993  Hsue ................................ 437/43
5,561,624  10/1996  Chen et al. ..................... 257/390

Primary Examiner—Tom Thomas
Assistant Examiner—David B. Hardy
Attorney, Agent, or Firm—Barnes,Kisselle,Raisch, Choate, Whittemore & Hulbert P.C.

[57] ABSTRACT

A multi-level memory cell structure, and a method of fabrication thereby is disclosed. In a mask ROM memory device, the conventional binary data storage cell is replaced with a 16-level data storage cell. The 16-level cell is programmed with a selected one of 16 values by forming a void in a portion of the word line over the memory cell having one of 16 widths corresponding to the preselected code to be stored therein. The portion of the word line associated with the coded memory cell has an effective remaining width corresponding to the preselected code. When the memory cell is enabled by activating its associated word line, due to the variable width of the word line forming the gate of the memory cell, one of 16 discrete currents flow in the 16-level memory cell structure. The current is indicative of the preselected code stored in the cell.

8 Claims, 3 Drawing Sheets

| | |
|---|---|
| ▨ POLY | ⋀ FIELD REGION |
| ☐ CODE WINDOW | ▦ CONTACT |
| ‖ METAL | |

| | |
|---|---|
| ☐ CODE WINDOW | ▨ POLY WORD LINE |
| ⋮ METAL BIT LINE | ▨ BURIED N+ BIT LINE |

MASK ROM CELL STRUCTURE WITH MULTI-LEVEL DATA SELECTION BY CODE

FIELD OF THE INVENTION

The present invention relates generally to a memory device having a mask ROM cell structure, and more particularly, to a memory device having a mask ROM cell structure with multi-level data selection by code, where data is stored in $2^n$ bit format where n is a positive integer.

BACKGROUND OF THE INVENTION

In conventional memory devices, data is stored in memory cells in a binary format (i.e., as either a "zero" or a "one"). As technology advanced, and the capacity of such memory devices increased, the number of these "binary format" memory cells increased accordingly such that the memory cell array portion of the device occupied an exceedingly large area, which made volume production of such memory devices difficult.

In the advancement of a mask ROM device, in light of the ever increasing memory cell density, the architecture of a mask ROM cell has gone through many revolutions in an effort to maintain a reasonable chip size and to allow a volume production. One solution that has been investigated rather thoroughly has been to reduce the physical area or size occupied by the prior binary-format memory cells. Thus, it was recognized that the future development of even higher density mask ROM devices, although limited in one way by conventional layout rules, was limited in a second way by the difficulty involved in achieving a reduced memory cell size, especially when a MOS element is used as the memory cell element. However, there are no other architectures, other than MOS technology, that can be used to fabricate the memory element in order to reduce the memory cell size. Thus, an effective technology to reduce the cell size has been a focal point of development semiconductor industry. For example, a conventional binary or two-state cell has evolved into an X cell, which uses the same circuit symmetry with a different layout than a conventional cell. Another example is a flat cell which provide a buried n+ bit line, and a virtual ground layout to get a smaller bit line pitch. These improvements have made possible the production of mask ROM devices in a capacity of 128K, 256K, 1M, 4M, 16M, and even 32M bit having a reasonable chip size by a mass production method. However, such increased device capacities have not come without a cost. These advanced manufacturing processes are generally made more complicated and/or difficult to control than their predecessor in order to gain the above-mentioned reductions in memory cell size.

It is therefore an object of the present invention to provide a mask ROM cell structure that does not have the shortcomings of the prior art mask ROM memory cell structures.

It is another object of the present invention to provide a mask ROM cell structure that is effectively reduced to less than half the size required by prior structures of equivalent storage.

It is a further object of the present invention to provide a mask ROM cell structure that has effectively reduced its cell size to less than half the size of prior structures of equivalent storage without adding complexity to the production or manufacturing process.

It is yet another object of the present invention to provide a mask ROM cell structure that has a cell size less than half the size of prior structures of equivalent storage by utilizing a multi-level data storage unit to replace the conventional binary data storage unit.

It is still another object of the present invention to provide a mask ROM cell structure having a cell size less than half the cell size of prior binary structures of equivalent storage by utilizing a 16-level or 32-level data storage memory cell.

SUMMARY OF THE INVENTION

This invention generally provides a memory cell structure for storing $2^n$ data levels, where n is a positive integer, selected by code. The memory cell structure in accordance with this invention includes a semiconductor substrate of a first conductivity type, a buried bit line of a second conductivity type formed in and on the substrate, a memory transistor connected to the bit line, and a word line of conductive material that is coupled to the memory transistor. The word line is formed within a preselected width W above the substrate and includes a void centered therein having a preselected one of $2^n$ widths, corresponding to a respective one of the $2^n$ data levels to define a pair of equal width, parallel conduction parts. The memory transistor includes a channel formed in the substrate contiguous to the bit line for carrying a preselected one of $2^n$ current levels corresponding to the preselected width of the void when the word line is enabled, the carried current being indicative of the preselected one of the $2^n$ data levels. Thus, the code used to select what data to store in the inventive memory cell structure is directly translated to the width W of the void formed in the word line and, accordingly, the effective remaining width of the portion of the word line associated with the memory cell. Thus, a multi-level data storage unit which can store $2^n$ data levels, is used to replace a conventional binary data storage unit, which is capable of storing only two data levels (i.e., "zero" and "one"). In a preferred embodiment, the improved cell structure stores data in a 4 D/C format (i.e., n=4) such that more than half of the space occupied by the cell array can be saved and an even smaller chip size can be realized in a high density mask ROM. Thus, in the 4-bit data storage unit embodiment, that data storage capacity is equivalent to four binary data storage units (i.e., $2^4=16$). Further, in the preferred embodiment, the substrate is formed of p-type material, the bit line is formed of n-type material, and the word line is formed of either polysilicon or polycide.

In a further aspect of the present invention, a memory device having memory cells wherein each memory cell stores $2^n$ data levels is provided. A memory device in accordance with this aspect of our invention includes a semiconductor substrate of a first conductivity type, a plurality of memory cells arranged in x rows and y columns wherein each memory cell carries one of $2^n$ current levels, said carried current level being indicative of the data level preselected for storage therein, x word lines of a conductive material associated with the memory cells in each row, y buried bit lines of a second conductivity type associated with the memory cells in each column, and, each sense amplifier coupled to a selected bit line for sensing a respective carried current and generating a multi-level output data in response thereto. Each of the memory cells in the memory device is substantially the same as described above. It should be understood, however, that since a row of the multi-level memory cells share the same word line, only that portion of the word line associated with a respective memory cell includes the void with a width corresponding to the preselected one of the $2^n$ data levels coded therein. Thus, the width of the void formed in each word line varies, in discrete widths, in accordance with the preselected code stored in the memory cells.

In a preferred embodiment of the inventive memory device, each sense amplifier has $2^n-1$ differential-type subamplifiers, having a pair of inputs, one of the inputs being coupled to a dummy memory cell with one of $2^n$ data storage levels, with the other input being coupled to the bit line associated with the amplifier.

BRIEF DESCRIPTION OF THE DRAWINGS

Other objects, features and advantages of the present invention will become apparent upon consideration of the specification and the appended drawings, in which.

DETAILED DESCRIPTION OF THE PREFERRED EMBODIMENT

Figure 1:
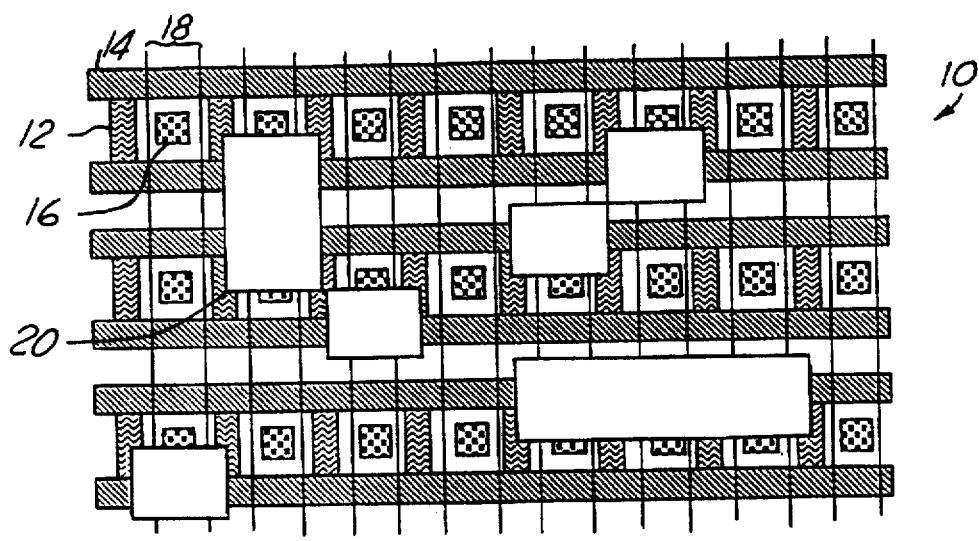
FIG. 1 is a partial, diagrammatic view showing the structure of a conventional mask ROM cell.

Referring now to the drawings wherein like reference numerals are used to reference identical components in various views, FIG. 1 depicts the conventional mask ROM cell structure of a conventional mask ROM device 10. Device 10, as is well known to one in ordinary skill in the art, includes field oxide regions 12, polysilicon (or polycide) conducting regions 14, contact areas 16, and a metallurgy system, including metal regions 18. The process of Device 10 is a matured device. However, a larger cell size limited the application of the conventional cell on high density product design.

It should be appreciated that the limiting factor in increasing the density by reducing the memory cell size relates to the size of the contact 16. That is, there exists a limit on how small the contact can be fabricated, thus limiting the reduction in size of the memory cell itself. Since the size of the cells in the conventional device 10 has a lower bound, an increase in the capacity of device 10 directly results in an increase in the chip size, which leads to poor yield for mask ROM devices having a capacity much larger than about 1M–2M bit.

Figure 2:
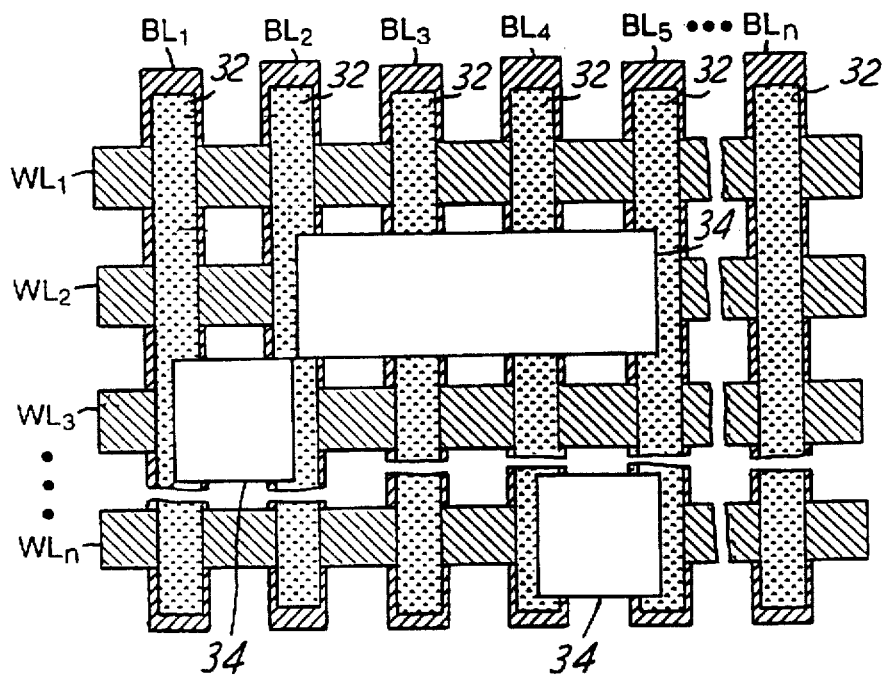
FIG. 2 is a partial, diagrammatic view showing the structure of a conventional BN+ memory cell.

Referring now to FIG. 2, a partial, diagrammatic view of a further conventional mask ROM cell structure, the BN+ cell structure, incorporated into a memory device 30 is shown. The device 30 includes columns of buried N+ bit lines BL1, BL2, BL3, BL4, BL5, . . . , BLn, and rows of word lines WL1, WL2, WL3, . . . , WLn, fabricated of conductive material such as polysilicon (or polycide). The device 30 further includes metal bit lines 32 disposed as shown in FIG. 2, wherein memory cells, in the form of a memory transistor, are defined in a region between adjacent bit lines and associated with a respective portion of a word line WLi. Also shown in FIG. 2 are code windows 34 (blackened areas). Code windows 34 represent areas that are the subject of an ion implantation step for programming a preselected "code" into the windowed "memory cell." For example, when it is desired to program a "0" into a memory cell, a photomask procedure is followed such that implantation does not occur for that cell. Similarly, when it is desired to program a "1" into a memory cell, the photomasking procedure is followed such that implantation does occur. This implantation procedure is well known in the Art. See, for example, U.S. Pat. No. 5,264,386 issued to Yang, entitled "Read Only Memory Manufacturing Method," assigned to United Microelectronics Corporation, and herein incorporated by reference. The BN+ memory cell structure is a cell with a smaller size than Device 10, and is used in 22M mass production product.

One disadvantage of using the cell structure as shown in FIG. 2 for memory device 30 is that the implantation must occur through the poly (either polysilicon or polycide) word line. Since the machines used in the manufacturing process have a limited implantation energy (e.g., 200 kev), the thickness of the word line must be restricted to ensure that the ions reach the substrate. However, because the thickness of the word line is limited by design, its resistance increases relatively, since resistance is proportional to the cross-sectional area of the word line. The higher the word line resistance, the slower the operating speed (i.e., response time) of the cell structure.

Another disadvantage with the cell structure of device 30 is that the associated manufacturing process is more difficult to control. Because a relatively high ion implantation energy must be used to effect ion implantation through the poly word line WLi, both Rp (the depth of ion penetration) and Rp (standard deviation) increase. This increase means that for a given dose, as the implant penetrates deeper into the substrate, spreading occurs and the peak ion concentration decreases. Thus, the manufacturing process becomes more difficult to control.

Other disadvantages with the cell structure used in memory device 30 include a low "off" cell breakdown voltage, and a generally higher bit line BLi resistance, both effects caused in great part, by the strong p-type dopant used in the ion implantation (code implant) step.

Before proceeding to a description of the present invention referenced to the drawings, a general discussion of the present invention will be set forth. In sum, the present invention can effectively reduce the memory cell size to less than half of the size of the prior cell structures of equivalent storage without making the manufacturing process more complicated. An embodiment of the present invention utilizes a multi-level data storage unit, which stores $2^n$ n data levels, to replace a conventional binary data storage unit. For a 4-bit (or 16-level) format memory cell structure, the data that can be stored is effectively equivalent to the amount of data that can be stored in four binary data storage units (i.e., $2^4=16$). The advantages of the present invention are immediately applicable to VLSI mask ROM memory design as follows. If a conventional binary data storage unit is used in fabricating a 16M bit memory device, then 16M binary data storage units are required. However, if a 16-level data storage unit is utilized, the total unit cells required is only one-quarter of the number of cells (i.e., 4M). The number of bits selected to be stored in a single data storage unit (i.e., the number of levels), depends on the processing capability (e.g., 0.5 µm process available), the quality requirements, and yield requirements. For example, the present invention provides advantages even for 2-level (i.e., "binary") memory cells, although the benefits of increased density become more apparent for 4-level, 8-level, 32-level, 64-level . . . etc., memory cell structures.

Figure 3:
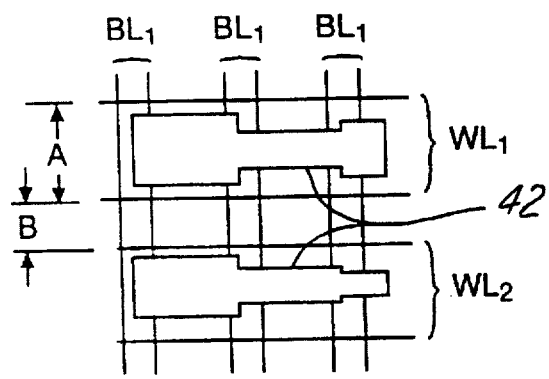
FIG. 3 is a partial, diagrammatic view showing the word line width/spacing relationship of a multi-level memory cell embodiment fabricated in accordance with the present invention.

Referring now to FIG. 3, a memory device 40 having a multi-level memory cell structure is depicted. The following description is made with reference to a 16-level storage unit that is based on a 0.5 micron VLSI manufacturing process. An initial step in a method of fabricating an embodiment in accordance with the present invention is a poly word line masking step. It should be appreciated by those of ordinary skill in the art that there are a plurality of methods that may be employed to fabricate a structure suitable for the above-mentioned poly word line masking step. Reference is made to U.S. Pat. No. 5,236,853, issued to Hsue, entitled "Self-Aligned Double Density Silicon Lines for ROM and EPROM," and assigned to United Microelectronics Corporation, which discloses one method of fabricating a complete ROM structure. In such a method, the silicon line pitch is the same as traditional ROM cells but every cell can store more than one binary data (for example, $2^4=16$). A sixteen level ROM cell can work on 4-bit binary ROM cell. The process and masking step are the same as used in a traditional ROM cell.

FIG. 3 shows that the formed word lines have a width of A, while the spacing between word lines is B. Preferably, with the 0.5 micron process, the ratio of width/spacing of the word line inside the cell is 1.55/0.5. FIG. 3 also shows a code mask 42, the purpose of which will become apparent. After the conventional processing step of N+, P+ processing are completed, a code masking step and corresponding processes are carried out. The masking process is similar to a traditional masking step. The coding method uses etching method (i.e., etching partial a poly word line) but not a code implant.

Figure 4A:
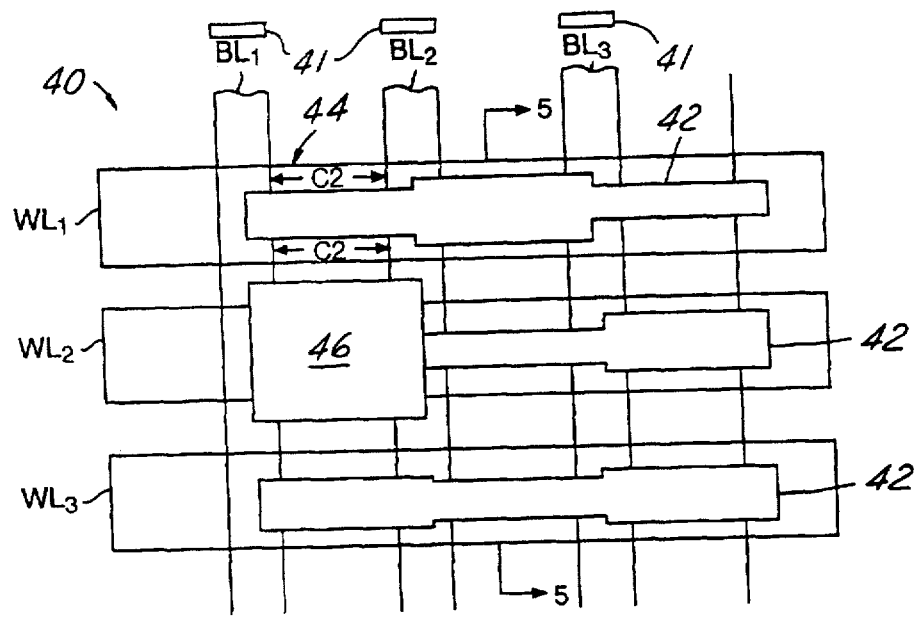
FIG. 4A is a partial, diagrammatic view of the embodiment of the present invention shown in FIG. 3, particularly depicting a modified word line used to implement the multi-level data code selection scheme.

Referring now to FIG. 4A, a partial, diagrammatic view of device 40 is shown. The device 40 includes a plurality of memory cells 44 arranged in x rows and y columns. The word lines WL are associated with the memory cells in each row, while the bit lines BL, which may be formed of n-type material, are associated with the memory cells in each column. Device 40 further includes a sense amplifier 41 coupled to each bit line for sensing a current through an enabled memory cell and generating a multi-level output code in response thereto.

Figure 4B:
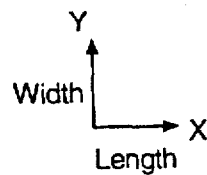
FIG. 4B depicts the memory cell orientation with regard to length and width.

As with conventional memory device 30, device 40 includes a plurality of memory cells 44. The code stored in cell 44 depends directly on the "code mask" 42, particularly the width of the code mask 42 as width is defined along the y-axis shown in FIG. 4B. The shape of the code mask 42 inside the memory cells are rectangles having the same length, but having a different width W. These "codes" are connected tightly together. For a 16-level storage cell, a total of 16 discrete widths are used, for example, 0.5 µm, 0.55 µm, 0.6 µm, 0.65 µm, 0.7 µm, . . . 1.25 µm. It should be appreciated that the 0.5 µm process defines the smallest step in the width dimension. As the spacing parameter for the process decreases so would the minimum step in terms of width. After a pattern for photoresist is formed, the word line material (e.g., polysilicon), is etched away by a poly etcher. For example, any to type anisotropic dry etcher is practical. Since a predetermined portion of the word line has been etched away (and initially the word lines are of a predetermined fixed width), the final effective width of a 16-level memory cell also comes in 16 predetermined, discrete widths (e.g., 105 µm, 1.0 µm, 0.95 µm, . . . 0.35 µm and 0.3 µm). This is the effective width of the word line (and, accordingly, transistor channel), since the word line has been divided into two mirror-image parts.

As shown in FIG. 4A, cell 44, after the word line etching process, has been divided into substantially parallel and equal width conduction parts: C1 and C2. This width change in a 16-level MOS transistor (i.e., memory cell) is reflected in the characteristics of the MOS transistor (i.e., the channel of the MOS transistor carries 16 discrete current levels, when the word line is enabled, corresponding to the 16 different effective word line widths). The effective word line widths are, in turn, a function of the selected void width, which in turn correspond to the 16 different data levels in which the memory cell may be programmed or selected by code window 42. Alternatively, the resulting structure can be viewed as a 16-level resistance value storage unit. It should be appreciated that the two conduction parts per cell need not be equal width.

It should be appreciated that by changing the width of the word line, the current flowing in the memory transistor channel to 16 discrete levels is modulated. Since the widths of the code window 42 has sixteen levels, the WL width can be one of the different sixteen WL widths. The device 40 is the cell transistor, and this transistor width (here is WL1, WL2, WL3) is one of sixteen available widths. The width of each cell is determined by the coding mask step and the etching process.

Region 46 in FIG. 4A illustrates the area that would be occupied by four binary storage cells (i.e., the equivalent of one 16-level storage cell shown in FIG. 4A). It should be appreciated that the improved mask ROM cell structure reduces the space used by more than half of that which would be occupied by an equivalent array of binary memory cells. As a result, a relatively small chip size can be obtained, even for a high density mask ROM chip.

Figure 5:
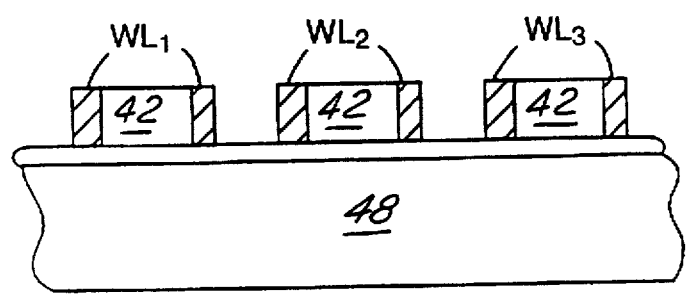
FIG. 5 is a partial, diagrammatic, cross-sectional view of the embodiment of the present invention taken along section 5—5 of FIG. 4A.
Figure 5A:
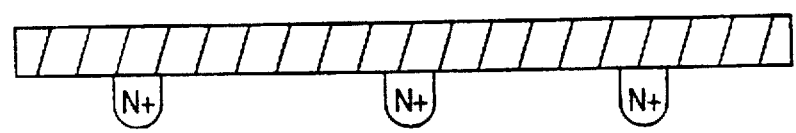
FIG. 5A is a cross section of the embodiment shown in FIG. 5 illustrating the buried N+ channels.

Referring now to FIG. 5, a cross-sectional view of device 40 is shown having multi-level storage cells. The structure 40 includes a semiconductor substrate 48 of a first conductivity type, preferably p-type. While FIG. 5 is a Y direction cross-section, the buried N+ channels can be observed in a X direction cross-section as shown in FIG. 5A.

Figure 6:
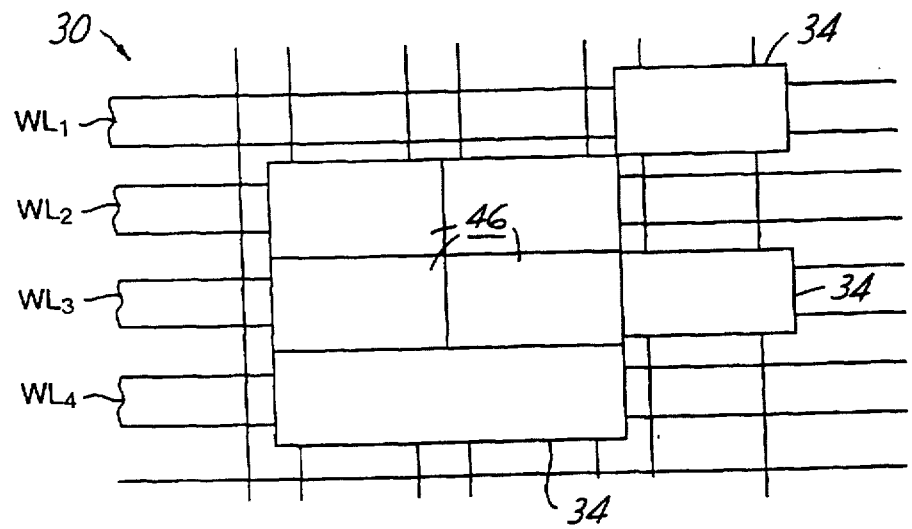
FIG. 6 is a partial, diagrammatic view showing, in further detail, the conventional BN+ cell structure of FIG. 2, particularly the conventional code implant scheme used in the conventional structure, as shown by the blackened areas.

Referring now to FIG. 6, conventional device 30 is shown in a columnar aligned orientation with device 40. It should be appreciated from FIG. 4A and FIG. 6 that although the memory cells have the same length, the cells used in device 40 have a greater width. The pitch of the cell array in device 40 is, accordingly, larger than the pitch obtained in device 30. The process of fabricating device 40 is continued with conventional BPSG, contact, and metal processes, which are carried out to complete manufacture.

It should be appreciated by one of skill in the art that a data sensing means must be provided in device 40 to complete a functioning memory device. This data sensing means needs to be matched with the other structures (i.e., multi-level storage unit) and their multi-current level operation. This data sensing function may be accomplished in many different ways, using many different means, well known to one of ordinary skill in the art. One way to sense the multi-level cell output may be to match the multi-level storage unit with a dummy cell (e.g., one for each of the 16-levels, in the above-described embodiment), and couple the cell output to a differential amplifier. The differential amplifier includes two inputs, one for the dummy cell output (for comparison purposes), and one for the memory cell being sensed.

As a further improvement to the device, the thickness of the word line material may be increased wherein the speed (i.e., response time of a multi-level cell) can be increased and the data sensing capability, accordingly, also improved.

Fabrication of an embodiment in accordance with the present invention is accomplished through the use of a relatively simple processing method. With the exception of the code masking step and its associated processes, which is slightly different (i.e., improved) relative to the conventional ROM code masking step (i.e., an etch code rathere than an implant code), the remainder of the manufacturing steps in the fabrication process follows the original process without change. The method of the present invention therefore can be easily carried out, and furthermore, since the method of the present invention does not utilize ion implantation to perform the code masking step, the following benefits can be realized over conventional methods and devices manufactured thereby.

(1) Problems caused by a relatively low breakdown voltage of an "off" cell, as is frequently encountered in a conventional binary unit, are minimized or eliminated.

(2) The conductive material used to form the word line (e.g., polycide), can be made thicker such that an RC delay is reduced, since word line thickness is not a limitation at least insofar as the sufficiency of the energy required for the code implantation step is concerned.

(3) The area occupied by a cell array can be reduced to less than half of convention arrays of equivalent storage. As the number of levels used increases, the saving in are also increases.

(4) Control of the manufacturing process is relatively easier to achieve compared to a conventional manufacturing process, due to the avoidance of dopant "spread".

While the present invention has been described in an illustrative manner, it should be understood that the terminology used is intended to be in the nature of words of description rather than of limitation.

Furthermore, while the present invention has been described in terms of a preferred embodiment thereof, if is to be appreciated that those skilled in the are will readily apply these teachings to other possible variations of the invention.

The embodiments of the invention in which an exclusive property or privilege is claimed as defined as follows:

1. A multi-level memory cell structure for storing $2^n$ data levels where n is a positive integer greater than one, comprising:

a semiconductor substrate of a first conductivity type;

a buried bit line of a second conductivity type formed in said substrate;

a memory cell connected to the bit line;

a word line of a conductive material coupled to said transistor and being formed within a preselected width W and having a void centered therein having one of $2^n$ preselected discrete widths corresponding to a respective one of the $2^n$ data levels to define a pair of substantially parallel conduction parts; and said memory cell having a channel formed in said substrate adjacent said bit line for carrying a preselected one of $2^n$ current levels corresponding to said preselected width of said void when said word line is enabled, said carried current being indicative of preselected one of the $2^n$ data levels.

2. The structure of claim 1 wherein n=4.

3. The structure of claim 1 wherein said first conductivity type is p-type and said second conductivity type is n-type.

4. The structure of claim 1 wherein said conductive material is polysilicon.

5. The structure of claim 1 wherein said conductive material is polycide.

6. A multi-level memory device having a plurality of memory cells each storing a preselected one of $2^n$ data levels where n is an integer greater than one, comprising:

a semiconductor substrate of a first conductivity type;

said memory cells arranged in x rows and y columns wherein each memory cell carries one of $2^n$ current levels, said carried current level being indicative of the data level preselected for storage therein;

x word lines of a conductive material associated with the memory cells in each row;

y buried bit lines of a second conductivity type associated with the memory cells in each column;

a sense amplifier coupled to each bit line for sensing a respective carried current and generating a multi-level output code in response thereto, each memory cell comprising:

a memory transistor connected to an associated bit line;

a portion of the word line associated with the respective memory cell being coupled to said transistor and being formed within a preselected width W and having a void centered therein having one of $2^n$ preselected discrete widths corresponding to a respective one of the $2^n$ data levels to define a pair of substantially parallel conduction parts;

said transistor having a channel formed in said substrate adjacent said associated bit line for carrying a preselected one of $2^n$ current levels corresponding to said preselected width of said void when said word line is enabled, said carried current level being indicative of a preselected one of the $2^n$ data levels.

7. The device of claim 6 wherein said sense amplifier is a differential-type amplifier having a pair of inputs, one of the inputs being coupled to a dummy memory cell having $2^n$ data storage levels, and the other input being coupled to a bit line of said sense amplifier.

8. The device of claim 6 wherein said conductive material of said word line comprises polysilicon.

* * * * *